United States Patent [19]

Wentzler

[11] Patent Number: 5,151,665
[45] Date of Patent: Sep. 29, 1992

[54] PHASE-LOCK-LOOP SYSTEM WITH VARIABLE BANDWIDTH AND CHARGE PUMP PARAMETERS

[75] Inventor: David D. Wentzler, North Richland Hills, Tex.

[73] Assignee: Uniden America Corporation, Fort Worth, Tex.

[21] Appl. No.: 652,182

[22] Filed: Feb. 7, 1991

[51] Int. Cl.⁵ .............................. H03L 7/093
[52] U.S. Cl. .......................... 331/8; 331/17; 331/25
[58] Field of Search ................. 331/17, 25, 8

[56] References Cited

U.S. PATENT DOCUMENTS

| | | | |
|---|---|---|---|
| 4,156,855 | 5/1979 | Crowley | 331/17 R |
| 4,546,330 | 10/1985 | Okada | 331/17 |
| 4,745,372 | 5/1988 | Miwa | 331/17 X |

Primary Examiner—Siegfried H. Grimm
Attorney, Agent, or Firm—Richards, Medlock & Andrews

[57] ABSTRACT

An improved phase lock loop frequency synthesizer capable of handling both analog and digital transmission. The synthesizer includes a reference signal source, a phase detector coupled to the reference signal source, a phase lock loop filter coupled to the phase detector, and a voltage controlled oscillator coupled to the phase lock loop filter for providing an output and a feedback signal to the phase detector. The phase lock loop filter comprising a charge pump coupled to the phase detector for providing a phase lock signal to a charge pump output node, said phase lock signal being variable in response to a bandwidth control signal; and a filter coupled to the charge pump for filtering the phase lock signal at a given bandwidth, said bandwidth being variable in response to the bandwidth control signal.

13 Claims, 3 Drawing Sheets

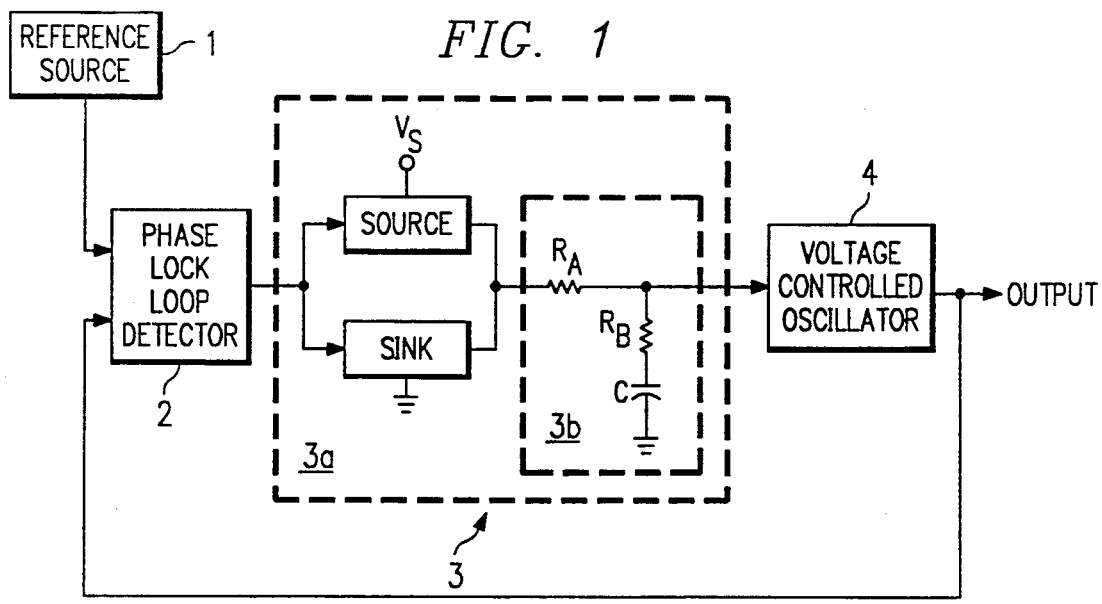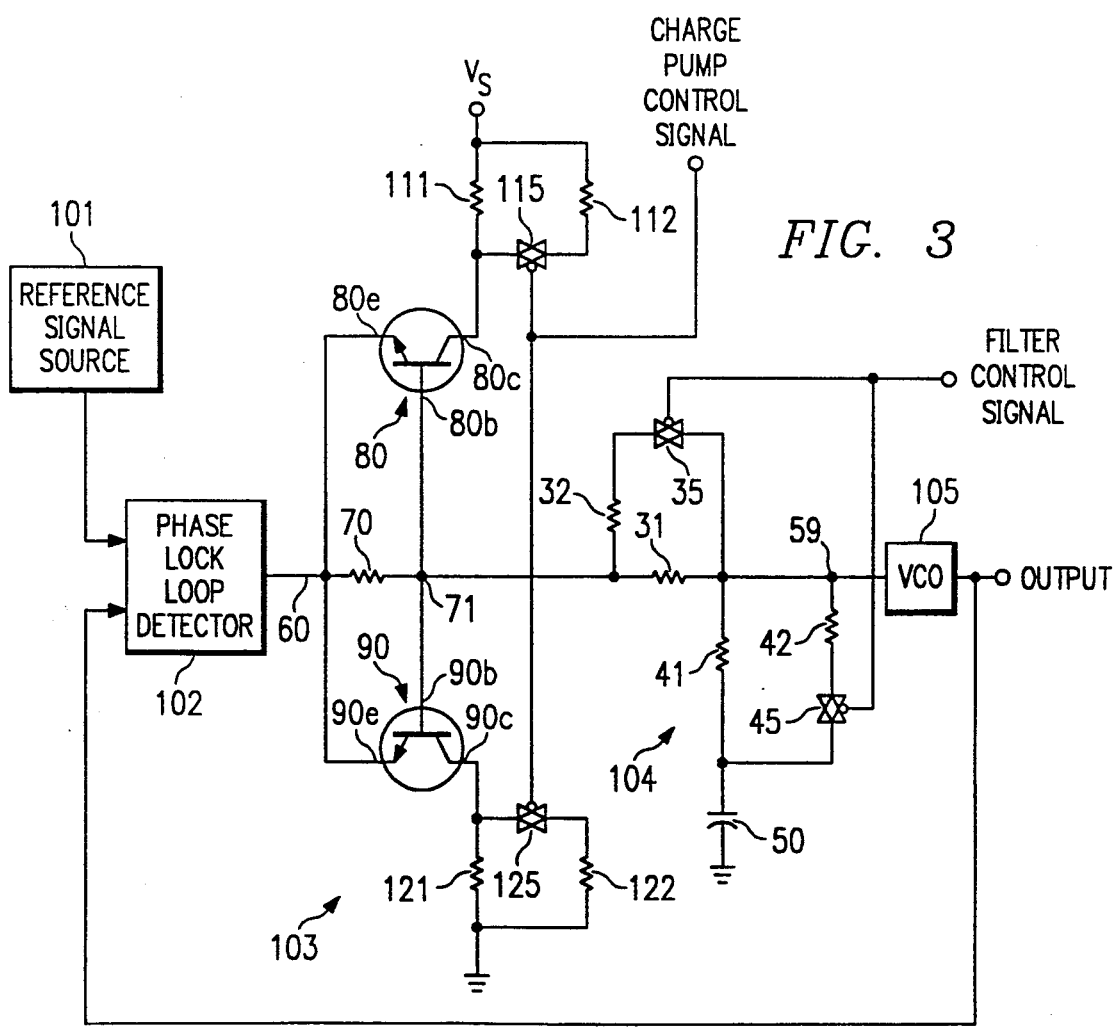

PHASE-LOCK-LOOP SYSTEM WITH VARIABLE BANDWIDTH AND CHARGE PUMP PARAMETERS

TECHNICAL FIELD OF THE INVENTION

The present invention pertains in general to a frequency synthesizer having a phase lock loop system which can be switched between a slow and a fast transition state by virtue of changing the performance characteristics of the charge pump and the loop filter elements.

BACKGROUND OF THE INVENTION

With radio frequency synthesizers and especially with digital cellular telephones, it is desirable to have an ability to switch between analog transmission and digital transmission states. Present day analog radio systems, such as analog cellular telephone systems, are not able to transmit or receive digital signals because of the frequency switching requirements of digital transmission. In particular, the necessity in digital technology that a receiver or transmitter switch rapidly between different frequencies requires that the circuitry be able to rapidly stabilize or "lock" quickly onto a particular frequency.

The need for fast frequency switching capabilities is even more imperative in cellular telephone systems using multiplexed digital technology where the synthesizer is not only handling two basic communication channels (send and receive), but is also handling an overhead channel (where additional information is transmitted, such as location, signal strength, alternative cell sites, billing information, etc.) as well as at least one additional group of send, receive, and overhead frequencies. The additional group(s) of frequencies is monitored in order to determine when the communication link should be handed off to another cell site with better signal strength. Thus, an ability to switch frequencies is especially important in the field of digital cellular communications because the input reference signal frequency is frequently switched so that an alternative frequency signal from an alternative cell site can be checked.

Present day analog systems are simply unable to lock onto a new frequency quickly enough for digital transmission requirements. Frequency switching limitations in analog radios are imposed, in part, by the design of the phase lock loop circuits, which are used in radio synthesizers to compare an incoming reference signal to a local oscillating signal for the purpose of locking the local signal to the input reference signal and obtaining information from the phase shifts detected between the two signals. Thus, phase lock loop circuits are used in radio receivers to obtain information from an incoming reference signal having a particular frequency.

Prior art frequency synthesizers utilize the phase lock loop configuration shown in FIG. 1 which includes an input reference signal 1, a phase detector 2, a phase lock loop filter 3, and a voltage controlled oscillator (VCO) 4 coupled as shown in the drawing. Although there are a number of different configurations for phase lock loop filters, the description of the invention provided herein is given with reference to the basic phase lock loop filter configuration shown in FIG. 1 which includes a charge pump 3a and a second order R-C low pass filter 3b. Such a configuration is suitable for analog transmission, but is not suitable for frequency switching required in digital transmissions. Of course, the present invention can be implemented with loop filters having a variety of configurations which differ from the loop filter described herein.

It will be appreciated by those skilled in the art that the frequency switching capability of the phase lock loop circuit configuration shown in FIG. 1 is improved by improving (decreasing) the lock time, and that the lock time for the phase lock loop frequency synthesizer is improved by increasing the loop filter bandwidth $W_n$ of the phase lock loop circuitry. However, the loop filter bandwidth $W_n$ can be only increased to a point before negative resistors are required in the filter $3b$.

Because the phase look loop filters as shown in FIG. 1 have only a limited ability to increase the bandwidth $W_n$, present day analog synthesizers cannot meet the lock time, and therefore the frequency switching, requirements of digital transmission without the addition of complex circuitry or extensive reworking of the design.

SUMMARY OF THE INVENTION

As will be explained below, the present invention relates to a phase lock loop circuit which can switch quickly with frequency changes in the input reference signal. In its regular or "analog" mode, the phase lock loop of the present invention detects phase shifts in the input reference signal in accordance with standard phase lock loop operation. But when the input reference signal changes frequency, the phase lock loop is switched into its "digital" mode to enable the circuit to quickly "lock" onto the new frequency before returning to the normal or "analog" mode of operation. The present invention enables the phase lock loop to lock quickly onto a new frequency by providing a "two-step" approach for increasing the loop filter bandwidth $W_n$ and therefore improving the lock time. The first "step" maximizes the performance of the filter element, as limited by constraints imposed by the charge pump and the overall phase lock loop synthesizer. The second step of the invention pushes back the constraints imposed by the charge pump and phase lock loop synthesizer, thereby enhancing the overall performance of the synthesizer.

The phase lock loop filter of the present invention includes a charge pump coupled to receive the phase error signal from a phase detector for providing a phase lock signal to a charge pump output node in response to the phase error signal. The phase lock signal provided to the output node is variable in response to a charge pump control signal in that charge is supplied or removed from the charge pump output node at a given rate in response to the phase error signal when the charge pump control signal is in a first state, and is supplied or removed at a different rate when the charge pump control signal is in a second state. The phase lock loop filter also includes a filter element coupled to the charge pump output node for filtering the phase lock signal at a variable bandwidth, said bandwidth being variably controlled by a filter control signal. In operation of one embodiment of the present invention, the charge pump control signal and filter control signal are coupled together to a bandwidth control signal so that the analog switches in the charge pump and filter are activated and deactivated together. In this way, when the rate of charge movement at the charge pump output node is increased, the resulting signal at the charge pump output node is filtered at a larger bandwidth by the filter.

In an alternative embodiment of the present invention, the charge pump control signal and filter control signal are operated independently of one another so that only the current flow at the charge pump output node is changed or so that only the bandwidth of the filter element is changed. Independent operation of the charge pump control signal and filter control signal may be desired when operating in either analog or digital mode and only limited improvement in the lock time is needed.

By reducing the "lock time" for a synthesizer, the synthesizer's performance ability to switch between frequencies is enhanced, and the synthesizer is thereby improved. It is therefore desirable to have a frequency synthesizer utilizing the standard phase lock loop configuration which switches between frequencies with a minimum lock time that is compatible with digital transmission requirements. In particular, one embodiment of the present invention utilizes the basic circuit configuration used in analog cellular radio transmission to create a digital cellular radio transmitter/receiver, thereby providing a cellular telephone system which can operate in both analog and digital modes.

BRIEF DESCRIPTION OF THE DRAWINGS

For a more complete understanding of the present invention and the advantages thereof, reference is now made to the following description taken in conjunction with the accompanying drawings in which:

FIG. 1 is a block diagram of a basic phase lock loop frequency synthesizer having a phase lock loop filter of standard design;

FIG. 3 is an alternative embodiment of the present invention showing a different charge pump configuration.

DETAILED DESCRIPTION OF THE INVENTION

As was noted earlier, the present invention is best explained with reference to the phase lock loop frequency synthesizer for analog radio having the basic loop filter configuration shown in FIG. 1. The loop filter bandwidth $W_n$ for the basic configuration shown in FIG. 1 is a function of the natural response $W_0$ of the synthesizer and the cutoff frequency $W_1$ of the filter $3b$ according to the equation $W_n^2 = W_0 W_1$ (Equation No. 1). With respect to the natural response $W_0$, it will be appreciated by those skilled in the art that the natural response $W_0$ is a function of the charge pump response $K_\phi$ (volts/rad) and the voltage controlled oscillator response $K_v$ (rad/volt-sec) such that $$W_0 = \frac{K_v K_\phi}{N}$$

Equation No. 2), where N is the divider factor for the operating frequency to obtain the reference frequency as generated by the divider which is coupled to the feedback input for the phase detector (not shown). It will further be appreciated by those skilled in the art that the cutoff frequency $W_1$ is a function of the resistor values $R_A$, $R_B$ and capacitor value C in the filter $3b$ such that $$W_1 = \frac{1}{(R_A + R_B)C}$$

(Equation No. 3).

As will be explained below, the present invention is actually a two-step improvement of the phase lock loop frequency synthesizer shown in FIG. 1, the object of which is to increase the loop filter bandwidth $W_n$ so that the lock time for frequency switching is correspondingly decreased. The first step is to increase the loop filter bandwidth $W_n$ by adjusting the performance of filter $3b$ so that the cut-off frequency $W_1$ is increased. However, this modification permits only limited increases in the loop filter bandwidth $W_n$ because of constraints imposed by the remainder of the phase lock loop synthesizer. The second step of the invention "pushes back" these constraints, thereby further enhancing the performance of the phase lock loop synthesizer by further increasing the loop filter bandwidth $W_n$.

Figure 2:
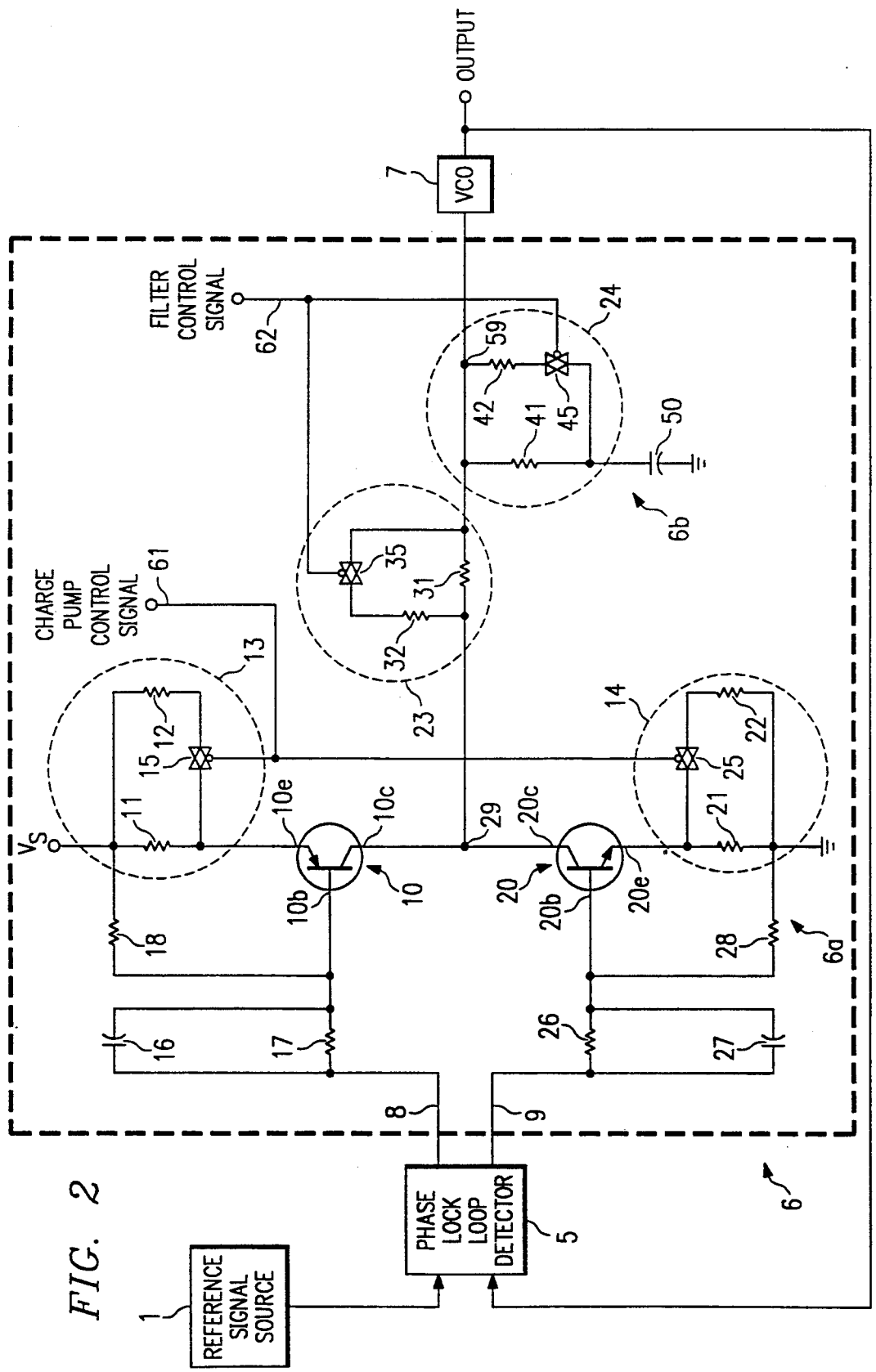
FIG. 2 is an electric schematic diagram of an embodiment of the present invention showing the filter and charge pump circuits.

There is shown in FIG. 2 a phase lock loop frequency synthesizer according to one embodiment of the present invention. The frequency synthesizer includes an input reference signal source 1 for providing an input reference signal; a phase detector 5 which is coupled to receive the input reference signal and which is coupled to receive a feedback signal from a voltage controlled oscillator (VCO) 7 for providing a phase error signal; a phase lock loop filter 6 coupled to the phase detector for providing a steering signal; and a voltage controlled oscillator 7 coupled to the phase lock loop filter 6 to provide a synthesizer output and a feedback signal to the phase detector 5. Although the VCO output is shown in FIG. 2 as being the synthesizer output, the output may instead be taken from the loop filter output node 59. The reference signal source 1 provides an input signal to the frequency synthesizer. It is the changes which occur in the frequency of the input reference signal which the phase lock loop circuit must quickly lock upon when digital transmission occurs.

There are many types of phase detectors contemplated as being within the scope of the present invention, including phase detectors having a single output or a plurality of outputs. Thus, the phase error signal from the phase detector may consist of a single signal or a number of signals, such as an error phase signal and a reference phase signal. Clearly, the types of signalling techniques for indicating a phase error will differ between different phase detectors. In a preferred embodiment of the present invention, the phase detector 5 includes two outputs, one for carrying an error phase signal 8 and the other for carrying a reference phase signal 9.

Coupled to receive the error phase signal 8 and reference phase signal 9 from the phase detector 5 is a charge pump $6a$ having a charge pump output node 29. The charge pump $6a$ provides a phase lock signal to the charge pump output node 29 which is coupled to the filter $6b$. The filter element $6b$ is coupled through the loop filter output node 59 to the VCO 7 which is in turn coupled to the synthesizer output and as a feedback signal to the phase detector 5.

In accordance with the present invention, the loop filter bandwidth $W_n$ is increased by increasing the natural response $W_0$. The natural response $W_0$ can be improved by either changing the response $K_\phi$ of the charge pump 6a or by changing the response $K_v$ of the VCO 7. Although charge pumps, like phase detectors, are available in any of a variety of configurations, any charge pump consists of at least a source transistor coupled to a first voltage level and a sink transistor coupled to the source transistor and coupled further to a second voltage level. The source and sink transistors can be bipolar junction transistors, field effect transistors, and indeed can be any "gate" element which passes a signal when properly activated.

Recognizing that the charge pump response $K_\phi$ of the charge pump 6a in FIG. 2 is a function of the current through the source transistor 10 ($I_{source}$) and sink transistor 20 ($I_{sink}$) of the charge pump when the synthesizer frequency is below the cutoff frequency $W_1$, and in particular that $K_\phi = (I_{source} + I_{sink})/4\pi$, the present invention increases $K_\phi$ (and accordingly $W_0$), by increasing the current through the source and drain transistors 10, 20. This current increase is achieved by reducing the coupling resistance between the charge pump's source and sink transistors 10, 20 and the respective voltage levels or voltage supplies to which these transistors are coupled. These coupling resistances are described herein as a first switchable resistor 13 and a second switchable resistor 14. Although the switchable resistors are depicted and described as being two resistors switchably coupled in parallel to one another, any device having a defined impedance is contemplated as being within the scope of the cclaims, including transistors, and other impedance means.

As shown in FIG. 2, the charge pump 6a can be switched between digital and analog operation by turning the analog switches 15, 25 on or off. (In the following description, the terms "emitter," "base" and "collector" are all used with reference to transistors which are bipolar junction transistors. If field effect transistors, which are contemplated as being within the scope of the present invention, are used to construct the described circuitry, the terms "drain," "gate" and "source" would be used instead.) In the analog mode, the source transistor 10 is coupled through its emitter 10e to a first switchable resistance 13 including first resistor 11 and a first switched resistor 12 parallel-coupled to the first resistor 11. The first switchable resistance 13 is coupled to a voltage source $V_s$. The collector terminal 10c of source transistor 10 is coupled to the collector 20c of sink transistor 20 at charge pump output node 29. The emitter 20e of the sink transistor 20 is coupled to ground through a second resistance 14 include second resistor 21 and second switched resistor 22 parallel-coupled to the second resistor 22. First and second switched resistors 12, 22 are disconnected from the charge pump 6a by the first and second analog switches 15, 25 which are turned off in response to the charge pump control signal which is applied at lead 61. The error phase signal output 8 from the phase detector 5 is coupled to the source transistor 10 through the parallel coupled capacitor 16 and resistor 17. Similarly, the reference phase signal output 9 is coupled to the sink transistor 20 through parallel coupled resistor 26 and capacitor 27.

In order to switch the charge pump 6a into digital mode, the analog switches 15, 25 are turned on by the charge pump control signal at lead 61 so that the first switched resistor 12 is connected in parallel across the first resistor 11 and the second switched resistor 22 is connected in parallel across the second resistor 21. The parallel combination of the first and second switched resistors 12, 22 effectively reduces the emitter resistance at the charge pump transistors, thereby increasing $W_0$ (and therefore $W_n$) by increasing the source and sink current flow at charge pump output node 29.

In further accordance with one embodiment of the present invention, the filter 6b of the phase lock loop filter 6 comprises a third switchable resistance 23 coupled to the charge pump 7a and to a loop filter output node 59, and a series-coupled fourth switchable resistance 24 and capacitor coupled to the loop filter output node 59. The filter 6b is designed to operate in at least two modes—analog operation and digital operation. In analog operation, the switched resistors 32, 42 are disconnected from the circuit by turning the analog switches 35, 45 off so that the filter 6b consists only of the filter input resistor 31 and the series-coupled resistor 41 and capacitor 50. In this mode, the filter 6b functions as a low pass filter suitable for analog transmission. The phase lock signal from the charge pump 6a is thus filtered under a low pass filter having a relatively small bandwidth when in the analog mode.

The loop filter bandwidth $W_n$ can be further increased beyond the increase provided by the charge pump 6a by reducing the resistance of the filter 6b. In one embodiment of the present invention, $W_n$ can be increased by switching the filter 6b such that analog switches 35, 45 are turned on and the switched resistors 32, 42 are connected in parallel to the filter input resistor 31 and the series-coupled resistor 41, respectively. The analog switches 35, 45 (and therefore, the parallel coupling of the switched resistors 32, 42) are activated in response to the filter control signal applied at lead 62. In this way, the resistance values of the filter 6b are reduced, thereby increasing the cutoff frequency $W_1$, according to Equation No. 3.

While this increase in the cutoff frequency $W_1$ does improve the loop filter bandwidth $W_n$ (as seen through the equation $W_n^2 = W_0 W_1$), the increase in the loop filter bandwidth $W_n$ is limited by the parallel resistor configuration in that $W_1$ can only increase to a point before negative resistor values are required for the parallel-coupled resistors 31, 32, 41, 42. In order to obtain a lock time on the order of two milliseconds or less needed for digital application frequency switching, the present invention provides a novel improvement of the filter 6b and charge pump 6a as described above.

As the rate of charge flow, or current, increases through the charge pump transistors 10, 20, the natural response $W_0$ increases, thereby further increasing the loop filter bandwidth $W_n$ above and beyond the increase permitted by only switching the resistors 32, 42 in the filter 6b. In this way, loop filter bandwidth $W_n$ is increased significantly without requiring negative or negligible resistance values in the filter 6b and this increase in the loop filter bandwidth $W_n$ permits frequency switching to occur with lock times on the order of two milliseconds or less.

Thus, the present invention provides a phase lock loop frequency synthesizer having a reduced lock time for frequency shifting. The improved lock time is achieved by increasing the loop filter bandwidth $W_n$. In order to provide a variable loop filter bandwidth $W_n$, the cutoff frequency $W_1$ in the filter 6b can be increased upon application of a filter control signal at lead 62, thereby filtering the phase lock signal received from the charge pump 6a at a higher bandwidth. In addition, the charge pump 6a is designed to provide a phase lock signal to the filter 6b in response to input from a phase detector 5. The phase lock signal is varied upon application of a charge pump control signal at lead 61 such that there is more current at the charge pump output node 29 when in digital mode with the analog switches 15, 25 turned on than when in analog mode with the switches 15, 25 turned off. While the analog switches at the charge pump 6a and filter 6b can be operated and controlled via charge pump control signal and filter control signal, these switches can instead be coupled to and controlled by a single bandwidth control signal such that the analog switches can be activated or deactivated simultaneously.

In any event, the control signals may be generated and applied under microprocessor control so that the necessary switches are turned on when a frequency change occurs so that the phase lock loop circuit can switch and lock to the new frequency quickly. The microprocessor may activate all the switches, or only some of the switches if only a limited reduction in the lock time is needed. For instance, the present invention also provides a benefit for straight analog radios where frequency switching occurs when a call is handed off from one cell site to another cell site. When such a hand off occurs, the static burst which sometimes occurs upon the transition in cell sites is significantly reduced by improving the lock time, even if only the charge pump switches are activated. Alternatively, the microprocessor controller may only activate the filter switches to obtain the desired lock time performance.

An alternative embodiment of the present invention is shown in FIG. 3 which includes a different charge pump configuration utilizing the charge pump response modification and filter bandwidth modification of the present invention. In particular, the phase detector 102 includes a single output 60 for providing a phase error signal to the charge pump 103. The source transistor 80 and sink transistor 90 of the charge pump 103 are both attached through their respective emitter terminals 80e, 90e to the phase detector output 60 to receive the phase error signal; the base terminals 80b, 90b of the charge pump transistors are both coupled to the charge pump output node 71; and the charge pump resistor 70 is coupled between the phase detector output 60 and charge pump output 71. The source transistor 80 is coupled to a first voltage level $V_s$ through a first switchable resistance comprising a first resistor 111 and a first switched resistor 112. Sink transistor 90 is coupled to a second voltage level (ground) through second switchable resistance comprising second resistor 121 and second switchable resistor 122.

In analog mode, the first switched resistor 112 and second switched resistor 122 are not coupled to the charge pump 103 because analog switches 115, 125 are turned off in response to the bandwidth control signal applied at lead 158. However, when the analog switches 115, 125 are activated such that the first switched resistor 112 and second switched resistor 122 are connected in parallel to the first resistor 111 and second resistor 121, respectively, the response $K_\phi$ of the charge pump 103 is increased, thereby increasing the response $W_0$ and correspondingly the loop filter bandwidth $W_n$ which permits faster locking times with frequency changes.

The equation $W_n^2 = W_0 W_1$ reveals how an increase in the natural response $W_0$ (which is a function of the charge pump response $K_\phi$) increases the loop filter bandwidth $W_n$. This same equation also illustrates how an increase in the cutoff frequency $W_1$ (which is a function of the resistor and capacitor values int eh filter component of the phase lock loop filter), also increases the loop filter bandwidth $W_n$. As can be seen from FIG. 3, the filter 104 is in the analog mode when the third resistor 31 is coupled to receive the phase lock signal from the charge pump output node 71, and the series-coupled fourth resistor 41 and capacitor 50 are coupled to the loop filter output node 59 which is itself coupled to the third resistor 31. But in digital mode, the resistance values of the filter 104 are reduced (thereby increasing the cutoff frequency $W_1$) by connecting in parallel third switched resistor 32 across the third resistor 31 and fourth switched resistor 42 to fourth resistor 41 in response to the bandwidth control signal at lead 58.

The combined effect of switching the resistors 112, 122, 32, 42 in parallel to the phase lock loop filter disclosed herein permits the loop filter bandwidth $W_n$ to increase so that the frequency shifting can occur with a lock time needed in digital applications.

Figure 4:
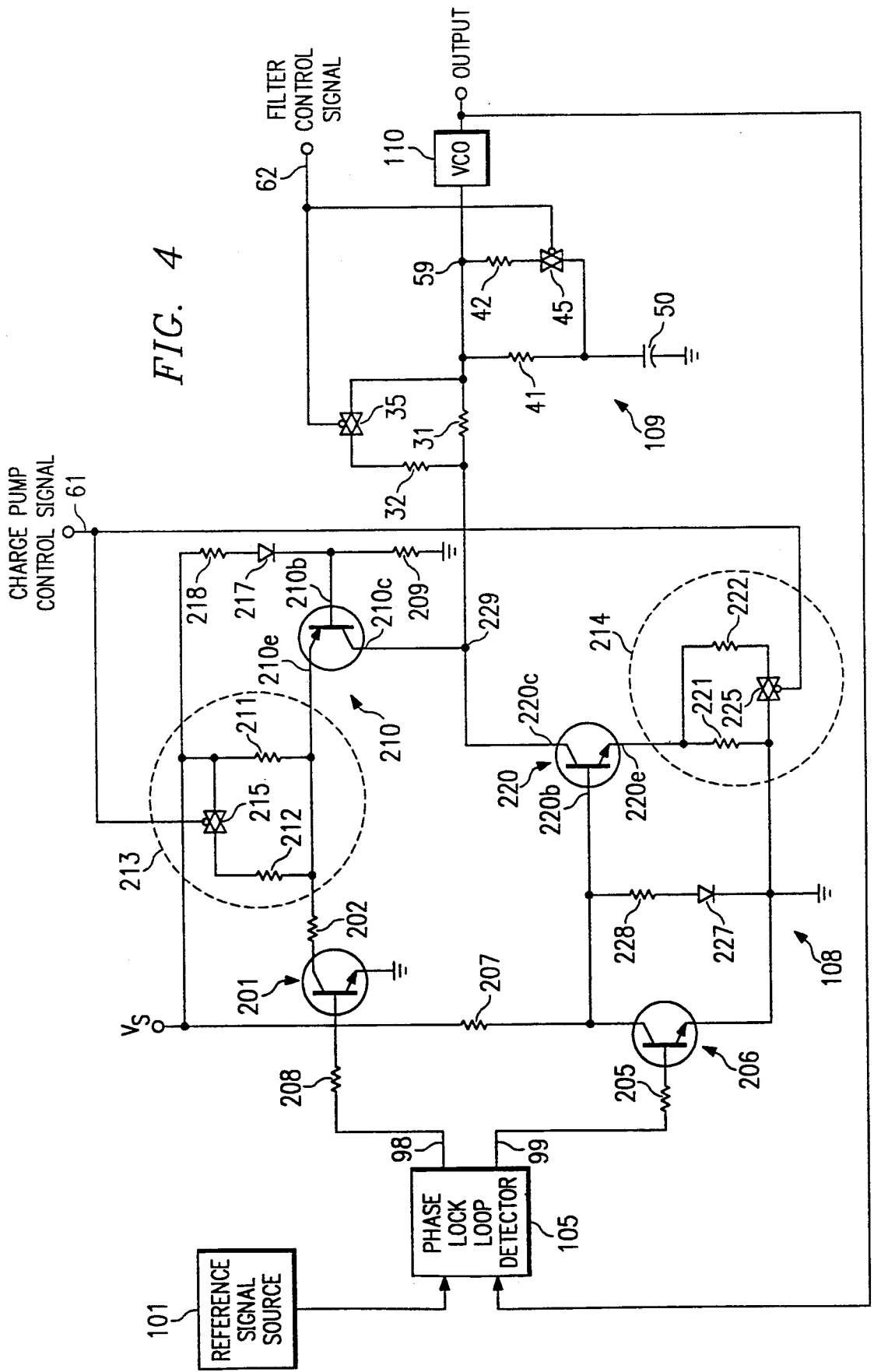
FIG. 4 is an alternative embodiment of the present invention showing another charge pump configuration.

The present invention is also shown in an alternative embodiment depicted in FIG. 4 which includes an alternative charge pump configuration utilizing the charge pump response modification of the present invention. Source transistor 210 and sink transistor 220 are both collector-coupled to the charge pump output node 229 for supplying and removing charge therefrom. The emitter 210e of the source transistor 210 is coupled to a voltage source through a first switchable resistance 213 including first resistor 211 and first switched resistor 212 which is parallel-coupled to the first resistor 211. Similarly, the emitter 220e of sink transistor 220 is coupled to ground through the second switchable resistance 214 including second resistor 221 and second switched resistor 222 parallel-coupled to second resistor 221.

Inverter transistors 201, 206 effectively invert the signals at the outputs 98, 99 from the phase detector 105 in order to stabilize the charge removal and supply function of the sink and source transistors 210, 220. In particular, transistor 201, which is emitter grounded, receives the error phase signal from phase detector output 98 through base resistor 208, thereby providing an inverted signal to the emitter 210e of source transistor 210 through resistor 202. Transistor 206, which s also emitter grounded, receives the reference phase signal from phase detector output 99 through bass resistor 205, thereby inverting the reference phase signal provided to the base 220b of sink transistor 220.

As can be seen from FIG. 4, the base 220b of the sink transistor 220 and the collector of the inverter transistor 206 are both coupled to a voltage source $V_s$ through resistor 207, and are further coupled to ground through the series-coupled resistor 228 and diode 227 which provides diode compensation for the sink transistor 220. Similarly, diode compensation is provided to the source transistor 210 through the series-coupled resistor 218 and diode 217 which are coupled between the voltage source $V_s$ and the base 210b of the source transistor 210 which is further coupled to ground through resistor 209.

Each of the analog switches 215, 225 which connect the first and second switched resistors 212, 222 in parallel to the first and second resistors 211, 221 are controlled by the charge pump control signal at lead 61 so that the rate of charge movement at charge pump output node 229 (also referred to as the phase lock signal) is faster when the switches 215, 225 are activated than when deactivated. In this way, the phase lock signal provided by the charge pump 108 to the filter 109 is variable in response to the charge pump control signal.

The present invention provides for reduced lock times in frequency switching by modifying the natural response $W_0$ and charge pump response $K_\phi$ with switchable two-state resistors wherein each two-state resistor consists of a primary resistor and a switched secondary resistor which is coupled in parallel to the primary resistor in response to a charge pump control signal, filter control signal or bandwidth control signal, whatever the case may be. It will be appreciated that the present invention encompasses the use of any element having two programmable impedance values greater than zero which can be selected in response to a control signal.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention.

I claim:

1. A frequency synthesizer including an input reference signal source of providing an input reference signal, a phase detector coupled to the input reference signal source for providing a phase error signal, a phase lock loop filter coupled to the phase detector for providing a steering signal, and a voltage controlled oscillator coupled to the phase lock loop filter and having an output signal coupled as a feedback signal to the phase detector, said phase lock loop filter, comprising:
a charge pump coupled to receive the phase error signal for providing a phase lock signal to a charge pump output node in response to the phase error signal, said phase lock signal being variable in response to a charge pump control signal; and
a filter coupled to the charge pump output node for filtering the phase lock signal at a given bandwidth, said bandwidth being variable in response to a filter control signal which is operated independently of the charge pump control signal.

2. The frequency synthesizer as defined in claim 1, wherein the charge pump comprises a source transistor and a sink transistor, each of said transistors being coupled to an output from the phase detector to receive the phase error signal and also being coupled to the charge pump output node, said source transistor being coupled to a first voltage supply by a first switchable resistance, and said sink transistor being coupled to a second voltage supply through a second switchable resistance.

3. The frequency synthesizer as defined in claim 2, wherein the source transistor and sink transistor are base-coupled to an output from the phase detector and collector-coupled to the charge pump output node, and the source transistor is emitter-coupled to the first voltage supply and the sink transistor is emitter-coupled to the second voltage supply.

4. The frequency synthesizer as defined in claim 2, wherein the first switchable resistance comprises a first switched resistor parallel-coupled to a first resistor, and the second switchable resistance comprises a second switched resistor parallel-coupled to a second resistor, said first switched resistor and second switched resistor being connected in parallel to the first resistor and second resistor, respectively, in response to the charge pump control signal.

5. The frequency synthesizer as defined in claim 1, wherein the filter comprises a loop filter output node which is coupled to the voltage controlled oscillator, a third switchable resistance coupled between the charge pump output node and loop filter output node, and a series-coupled fourth switchable resistance and capacitor coupled to the loop filter output node.

6. The frequency synthesizer as defined in claim 5, wherein the third switchable resistance further comprises a third switched resistor parallel-coupled to a third resistor, and the fourth switchable resistance comprises a fourth switched resistor parallel-coupled to a fourth resistor, said third switched resistor and fourth switched resistor each being connected in parallel to the third and fourth resistor, respectively, in response to the filter control signal.

7. A loop filter for a frequency synthesizer, said frequency synthesizer including a reference signal source for providing a reference signal, a phase detector coupled to the reference signal source for providing a phase error signal, a loop filter coupled to the phase detector for providing a steering signal, and a voltage controlled oscillator (VCO) coupled to the loop filter and having an output signal coupled as a feedback signal to the phase detector, said loop filter comprising:
a charge pump coupled to receive the phase error signal, said charge pump supplying or removing charge from a charge pump output node at a given rate in response to the phase error signal, thereby generating a phase lock signal, said rate being variable in response to a charge pump control signal; and
a filter coupled to the charge pump output node for filtering the phase lock signal received from the charge pump at a given bandwidth, said bandwidth being variable in response to a filter control signal which is operated independently of the charge pump control signal.

8. The loop filter as defined in claim 7, wherein the charge pump comprises a source transistor coupled to a first voltage supply through a switchable two-state source resistor and a sink transistor coupled to a second voltage supply through a switchable two-state sink resistor, each of said switchable two-state resistors consisting of a primary resistor and a secondary resistor coupled in parallel to the primary resistor in response to the charge pump control signal, wherein said source transistor and sink transistor are each coupled to the phase error signal and are each coupled to the charge pump output node.

9. The loop filter as defined in claim 7, wherein the filter comprises a loop filter output node which is coupled to the VCO, a first switchable two-state resistor coupled between the charge pump output node and the loop filter output node, and a series-coupled second switchable two-state resistor and capacitor coupled to the loop filter output node, each of said switchable two-state resistors comprising a primary resistor and a secondary resistor when the secondary resistor is coupled in parallel to the primary resistor in response to the filter control signal.

10. A frequency synthesizer compatible with both analog and digital transmission, including a reference signal source, a phase detector coupled to the reference signal source for providing a phase error signal, a phase lock loop filter coupled to receive the phase error signal, and a voltage controlled oscillator (VCO) coupled to the phase lock loop filter and coupled to the phase detector to provide a feedback signal, wherein said phase lock loop filter comprises:

a charge pump having a first transistor coupled through its base terminal to the phase error signal and a second transistor coupled through its base terminal to the phase error signal, said first and second transistors being coupled to a charge pump output node through their respective collector terminals, the emitter of said first transistor being coupled to a voltage source through a first resistor, the emitter of said second transistor being coupled to ground through a second resistor, a first switched resistor connected in parallel to the first resistor in response to a charge pump control signal, and a second switched resistor connected in parallel to the second resistor in response to the charge pump control signal; and a filter coupled to the charge pump output node, including a filter output node coupled to the VCO, a third resistor coupled between the charge pump output node and the filter output node, a series-coupled fourth resistor and capacitor coupled to the filter output node, a third switched resistor connected in parallel to the third resistor in response to a filter control signal, and a fourth switched resistor connected in parallel to the fourth resistor in response to the filter control signal.

11. A frequency synthesizer including an input reference signal source for providing an input reference signal, a phase detector coupled to the input reference signal source for providing a phase error signal, a phase lock loop filter coupled to the phase detector for providing a steering signal, and a voltage controlled oscillator coupled to the phase lock loop filter and having an output signal coupled as a feedback signal to the phase detector, said phase lock loop filter comprising:

a charge pump coupled to receive the phase error signal for providing a phase lock signal to a charge pump output node in response to the phase error signal, said phase lock signal being variable in response to a charge pump control signal; and a filter coupled to the charge pump output node for filtering the phase lock signal at a given bandwidth, said bandwidth being variable in response to a filter control signal, said filter comprising a loop filter output node which is coupled to the voltage controlled oscillator, a first switchable resistance coupled between the charge pump output node and loop filter output node, and a series coupled second switchable resistance and capacitor coupled to the loop filter output node.

12. The frequency synthesizer as defined in claim 11, wherein the first switchable resistance further comprises a first switched resistor parallel-coupled to a first resistor, and the second switchable resistance comprises a second switched resistor parallel-coupled to a second resistor, said first switched resistor and second switched resistor each being connected in parallel to the first and second resistor, respectively, in response to the filter control signal.

13. A loop filter for a frequency synthesizer, said frequency synthesizer including a reference signal source for providing a reference signal, a phase detector coupled to the reference signal source for providing a phase error signal, a loop filter coupled to the phase detector for providing a steering signal, and a voltage controlled oscillator coupled to the loop filter and having an output signal coupled as a feedback signal to the phase detector, said loop filter comprising:

a charge pump coupled to receive the phase error signal, said charge pump supplying or removing charge from a charge pump output node at a given rate in response to the phase error signal, thereby generating a phase lock signal, said rate being variable in response to a charge pump control signal; and a filter coupled to the charge pump output node for filtering the phase lock signal received from a charge pump at a given bandwidth, said bandwidth being variable in response to a filter control signal, said loop filter comprising a loop filter output node which is coupled to the voltage controlled oscillator, a first switchable two-state resistor coupled between the charge pump output node and the loop filter output node, and a series-coupled second switchable two-state resistor and capacitor coupled to the loop filter output node, each of said switchable two-state resistors comprising a primary resistor and a secondary resistor wherein the secondary resistor is coupled in parallel to the primary resistor in response to the filter control signal.

* * * * *